(12) United States Patent
Chandra et al.

(10) Patent No.: US 9,672,143 B2
(45) Date of Patent: *Jun. 6, 2017

(54) REMOTE MEMORY RING BUFFERS IN A CLUSTER OF DATA PROCESSING NODES

(71) Applicant: III HOLDINGS 2, LLC, Wilmington, DE (US)

(72) Inventors: Prashant R. Chandra, San Jose, CA (US); Thomas A. Volpe, Austin, TX (US); Mark Bradley Davis, Austin, TX (US); Niall Joseph Dalton, Mountain View, CA (US)

(73) Assignee: III HOLDINGS 2, LLC, Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/950,017

(22) Filed: Nov. 24, 2015

(65) Prior Publication Data

US 2016/0077999 A1    Mar. 17, 2016

Related U.S. Application Data

(63) Continuation of application No. 13/959,428, filed on Aug. 5, 2013, now Pat. No. 9,304,896.

(51) Int. Cl.
*G06F 12/00* (2006.01)
*G06F 9/54* (2006.01)
(Continued)

(52) U.S. Cl.
CPC ............... *G06F 12/00* (2013.01); *G06F 9/54* (2013.01); *G06F 13/1663* (2013.01);
(Continued)

(58) Field of Classification Search
CPC . G06F 15/17375; G06F 12/00; G06F 12/0223
See application file for complete search history.

(56) References Cited

U.S. PATENT DOCUMENTS 7,620,791 B1    11/2009    Wentzlaff et al.
7,688,737 B2     3/2010    Archer et al.
(Continued)

OTHER PUBLICATIONS

Non-Final Office Action on U.S. Appl. No. 13/959,428, mailed Apr. 7, 2015.
(Continued)

*Primary Examiner* — Mark Giardino, Jr.

(57) ABSTRACT

A data processing node has an inter-node messaging module including a plurality of sets of registers each defining an instance of a GET/PUT context and a plurality of data processing cores each coupled to the inter-node messaging module. Each one of the data processing cores includes a mapping function for mapping each one of a plurality of user level processes to a different one of the sets of registers and thereby to a respective GET/PUT context instance. Mapping each one of the user level processes to the different one of the sets of registers enables a particular one of the user level processes to utilize the respective GET/PUT context instance thereof for performing a GET/PUT action to a ring buffer of a different data processing node coupled to the data processing node through a fabric without involvement of an operating system of any one of the data processing cores.

19 Claims, 6 Drawing Sheets

(51) Int. Cl.
*G06F 13/16* (2006.01)
*G11C 7/10* (2006.01)
*G11C 21/00* (2006.01)
*G06F 13/00* (2006.01)
*G06F 13/28* (2006.01)
*G06F 15/173* (2006.01)
*G06F 12/02* (2006.01)

(52) U.S. Cl.
CPC ...... *G06F 15/17331* (2013.01); *G11C 7/1036* (2013.01); *G11C 7/1072* (2013.01); *G11C 21/00* (2013.01); *G06F 12/0223* (2013.01); *G06F 15/17375* (2013.01); *Y02B 60/1228* (2013.01)

(56) References Cited

U.S. PATENT DOCUMENTS

| | | | |
|---|---|---|---|
| 7,802,025 B2 | 9/2010 | Chen et al. | |
| 8,738,860 B1 * | 5/2014 | Griffin | G06F 12/0897 711/122 |
| 2002/0144081 A1 * | 10/2002 | Willis | G06F 12/1027 711/206 |
| 2003/0154246 A1 | 8/2003 | Ollikainen | |
| 2005/0055439 A1 * | 3/2005 | Piccirilli | H04L 43/062 709/224 |
| 2007/0140127 A1 * | 6/2007 | Frei | H04J 3/0655 370/238 |
| 2008/0307265 A1 | 12/2008 | Vertes | |
| 2010/0110083 A1 | 5/2010 | Paltashev et al. | |
| 2012/0077461 A1 * | 3/2012 | Das | H04L 63/0884 455/410 |
| 2014/0348182 A1 | 11/2014 | Chandra et al. | |

OTHER PUBLICATIONS

Notice of Allowance on U.S. Appl. No. 13/959,428, mailed Aug. 6, 2015.

* cited by examiner

| | +0 (7 6 5 4 3 2 1 0) | +1 (7 6 5 4 3 2 1 0) | +2 (7 6 5 4 3 2 1 0) | +3 (7 6 5 4 3 2 1 0) |
|---|---|---|---|---|
| BYTE 0 | 4 (Remote Memory) | Destination Connecton ID | | |
| BYTE 4 | Ring GET Request | Packet Sequence Number | | |
| BYTE 8 | Total Length | | AR | Reserved |
| BYTE 12 | Context # | | Ring Number | |
| BYTE 16 | Remote Key | | | |

| | +0 (7 6 5 4 3 2 1 0) | +1 (7 6 5 4 3 2 1 0) | +2 (7 6 5 4 3 2 1 0) | +3 (7 6 5 4 3 2 1 0) |
|---|---|---|---|---|
| BYTE 0 | 4 (Remote Memory) | Destination Connecton ID | | |
| BYTE 4 | Ring PUT Request | Packet Sequence Number | | |
| BYTE 8 | Total Length | | AR | Reserved |
| BYTE 12 | Reserved | T O | PUT Length | Ring Number |
| BYTE 16 | Reserved | | Context # | |
| BYTE 20 | Remote Key | | | |
| BYTE 24 | Timestamp 63:32 | | | |
| BYTE 28 | Timestamp 31:00 | | | |
| | PUT Payload | | | |

FIG. 9

| | +0 | +1 | +2 | +3 |
|---|---|---|---|---|
| | 7 6 5 4 3 2 1 0 | 7 6 5 4 3 2 1 0 | 7 6 5 4 3 2 1 0 | 7 6 5 4 3 2 1 0 |
| BYTE 0 | 4 (Remote Memory) | Destination Connecton ID | | |
| BYTE 4 | Ring GET Respone | Packet Sequence Number | | |
| BYTE 8 | Total Length | | A R | Reserved |
| BYTE 12 | Status | GET Length | Ring Number | |
| | GET Payload | | | |

| | +0 | +1 | +2 | +3 |
|---|---|---|---|---|
| | 7 6 5 4 3 2 1 0 | 7 6 5 4 3 2 1 0 | 7 6 5 4 3 2 1 0 | 7 6 5 4 3 2 1 0 |
| BYTE 0 | 4 (Remote Memory) | Destination Connecton ID | | |
| BYTE 4 | Ring PUT Response | Packet Sequence Number | | |
| BYTE 8 | Total Length | | A R | Reserved |
| BYTE 12 | Status | PUT Length | Ring Number | |

— 415

REMOTE MEMORY RING BUFFERS IN A CLUSTER OF DATA PROCESSING NODES

CROSS-REFERENCE TO RELATED PATENT APPLICATIONS

This application is a Continuation of U.S. application Ser. No. 13/959,428, filed Aug. 5, 2013, incorporated herein by reference in its entirety.

BACKGROUND

1. Field of the Invention

Embodiments of the present invention relate to implementation of remote memory ring buffers in data processing systems. More specifically, embodiments of the present invention relate to implementing a remote memory ring buffer in a cluster of data processing nodes such as fabric-attached Server on a Chip (SoC) nodes.

2. Description of Related Art

A ring buffer is a memory structure (i.e., an array). A first element in a ring buffer is followed by the last. In this regard, a ring buffer can be envisioned as being circular.

In the context of SoC nodes, it is known to implement one or more shared memory ring buffers in a manner whereby different data processing cores of a single SoC node can perform GET actions and/or PUT actions (i.e., GET/PUT actions) to a common ring buffer in shared memory (i.e., GET/PUT functionality via shared memory ring buffer). A memory controller of the single SoC node ensures that GET/PUT actions of one of the data processing cores are completed without interruption by other GET/PUT actions of the same of a different one of the data processing cores. The implementation of a shared memory ring buffer in this manner enables the different data processing cores of the single SoC node to store and retrieve information from the shared memory ring buffer.

In such a single SoC node implementation of a shared memory ring buffer, shared memory GET/PUT functionality is supported in hardware (HW) between different data processing cores of the SoC node. Furthermore, such a single SoC node implementation of a remote memory ring buffer is undesirably limiting in that it does not accommodate remote memory GET/PUT functionality by a traditional cluster of shared-nothing, network connected nodes.

Accordingly, implementing remote memory GET/PUT functionality via one or more remote memory ring buffers by a cluster of fabric-attached SoC nodes without involvement of an OS kernel of the SoC nodes would be advantageous, useful and desirable.

SUMMARY OF THE INVENTION

Embodiments of the present invention are directed to ring buffers shared by a plurality of server on a chip (SoC) nodes (i.e., data processing nodes) that are not connected with shared memory. More specifically, embodiments of the present invention are directed to implementing remote memory GET/PUT functionality via one or more ring buffers that are shared by a cluster of SoC nodes that are attached through a fabric (i.e., a switched interconnect fabric). Advantageously, the remote memory GET/PUT functionality is implemented using hardware (HW) supported GET/PUT contexts that can be mapped into address space of user level processes. By virtue of the hardware (HW) supported GET/PUT contexts being mapped into address space of user level processes, SoC nodes configured in accordance with the present invention can implement remote memory GET/PUT functionality using one or more remote memory ring buffers and without involvement of an OS kernel of any one of the SoC nodes.

In one embodiment, a data processing node comprises an inter-node messaging module including a plurality of sets of registers each defining an instance of a GET/PUT context and a plurality of data processing cores each coupled to the inter-node messaging module. Each one of the data processing cores includes a mapping function for mapping each one of a plurality of user level processes thereof to a different one of the sets of registers and thereby to a respective GET/PUT context instance. Mapping each one of the user level processes to the different one of the sets of registers enables a particular one of the user level processes to utilize the respective GET/PUT context instance thereof for performing a GET/PUT action to a ring buffer of a different data processing node coupled to the data processing node through a fabric without involvement of an operating system (OS) of any one of the data processing cores.

In another embodiment, a data processing system comprises a target node including a ring buffer in local memory thereof and a plurality of initiator nodes attached to each other and to the target node through a fabric. Each one of the initiator nodes comprises an inter-node messaging module and a plurality of data processing cores each coupled to the inter-node messaging module. The inter-node messaging module includes a plurality of sets of registers each having an instance of a GET/PUT context defined therein. Each one of the data processing cores includes a mapping function for mapping each one of a plurality of user level processes thereof to a different one of the sets of registers and thereby to a respective GET/PUT context instance. Mapping each one of the user level processes to the respective GET/PUT context instance enables a particular one of the user level processes to utilize the respective GET/PUT context instance mapped thereto for performing GET/PUT actions to the ring buffer of the target node through the fabric without involvement of an operating system (OS) of any one of the data processing cores. Mapping each one of the user level processes to the respective GET/PUT context instance includes modifying a memory management unit page table for the particular one of the user level processes to include a virtual address page that maps to a physical address page for the respective GET/PUT context instance.

In another embodiment, a method for performing remote memory GET/PUT functionality between data processing nodes interconnected through a fabric includes a plurality of operations. An operation is performed for mapping a user level process of a first data processing node to a particular set of a plurality of sets of registers of an inter-node messaging module of the first data processing node. Each one of the sets of registers defines an instance of a GET/PUT context such that the user level process is mapped to a respective GET/PUT context instance. Mapping the user level processes to the respective GET/PUT context instance includes modifying a memory management unit page table for the user level process to include a virtual address page that maps to a physical address page for the respective GET/PUT context instance. The user level process performs an operation for assessing a status of a previous GET/PUT action to a ring buffer in local memory of a second data processing node. The previous GET/PUT action used the respective GET/PUT context instance. The user level process performs an operation for populating fields of the respective GET/PUT context instance with information for a current GET/PUT action to the ring buffer in response to determining that the previous GET/PUT action is completed. The inter-node messaging module of the first data processing node performs an operation for causing a GET/PUT request to be transmitted for reception by a second data processing node in response to the inter-node messaging module creating the GET/PUT request using the information populating the fields of the respective GET/PUT context instance. The information populating the fields of the respective GET/PUT context instance includes an identifier for the second data processing node and a ring buffer identifier.

These and other objects, embodiments, advantages and/or distinctions of the present invention will become readily apparent upon further review of the following specification, associated drawings and appended claims.

BRIEF DESCRIPTION OF THE DRAWINGS

FIG. 7 shows an embodiment of a GET Request packet configured in accordance with an embodiment of the present invention.

FIG. 8 shows an embodiment of a PUT Request packet configured in accordance with an embodiment of the present invention.

FIG. 9 shows an embodiment of a GET Response packet configured in accordance with an embodiment of the present invention.

FIG. 10 shows an embodiment of a PUT Response packet configured in accordance with an embodiment of the present invention.

DETAILED DESCRIPTION

Embodiments of the present invention are directed to implementing GET/PUT functionality via one or more ring buffers that are shared by a cluster of SoC nodes (i.e., remote memory GET/PUT functionality) that are attached through a fabric (i.e., a switched interconnect fabric). Remote memory ring buffers are circular buffers implemented in local memory of a particular node of a cluster of nodes, which can be accessed by other nodes of the cluster. Nodes that initiate a GET action or a PUT action (i.e., GET/PUT action) are referred to herein as an initiator node and a node that is the target of such a GET/PUT action is referred to herein as a target node. These GET/PUT actions may be initiated directly by user-level applications without involvement of the OS kernel. Server on a chip (SoC) nodes that are interconnected within a fabric via a respective fabric switch are examples of data processing nodes that can serve as an initiator and target nodes in the context of the present invention. However, the present invention is not unnecessarily limited to any particular type, configuration, or application of data processing node.

Figure 1:
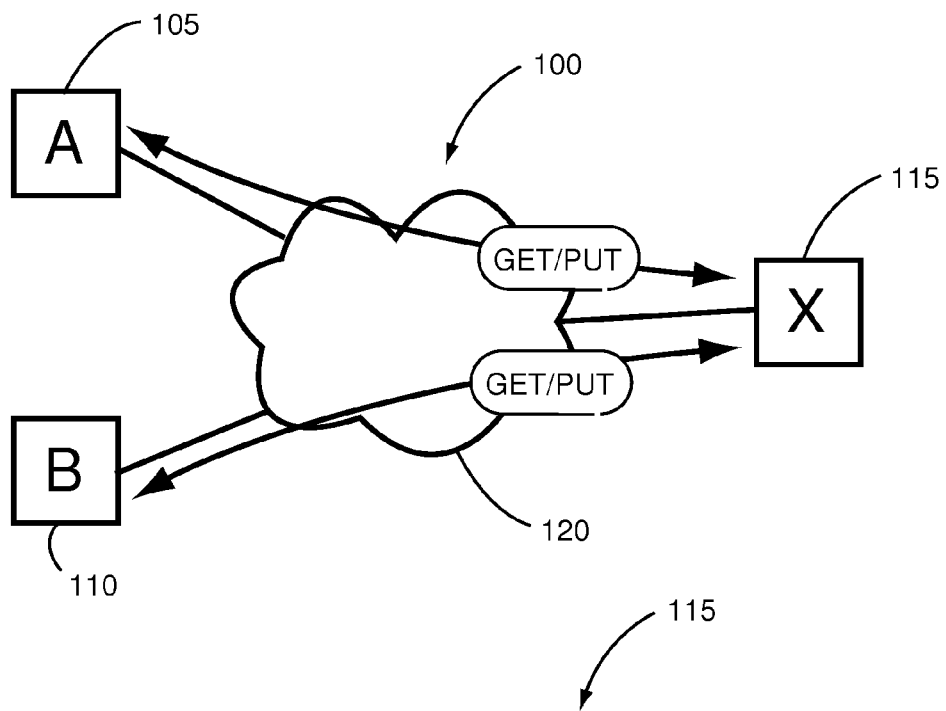
FIG. 1 shows a data processing system configured for enabling implementation of remote memory GET/PUT functionality in accordance with the present invention.

Referring now to FIG. 1, a data processing system 100 configured for enabling implementation of remote memory GET/PUT functionality in accordance with the present invention is shown. The data processing system 100 includes a first initiator node 105 (node A), a second initiator node 110 (node B) and a target node 115 (node X). The nodes 105-115 are SoC nodes (i.e., data processing nodes) attached to each other through a fabric 120. GET/PUT actions are implemented across the fabric 120 between initiator nodes 105, 110 and the target node 115. Payload content of the GET/PUT actions is stored on and access from one or more ring buffers (i.e., remote memory ring buffers). As is discussed below in greater detail, GET/PUT actions to a remote memory ring buffer in accordance with embodiments of the present invention are implemented using Configuration and Status Registers (CSRs) in an inter-node messaging module of the initiator node, which are mapped into user-level application's virtual address space.

Figure 2:
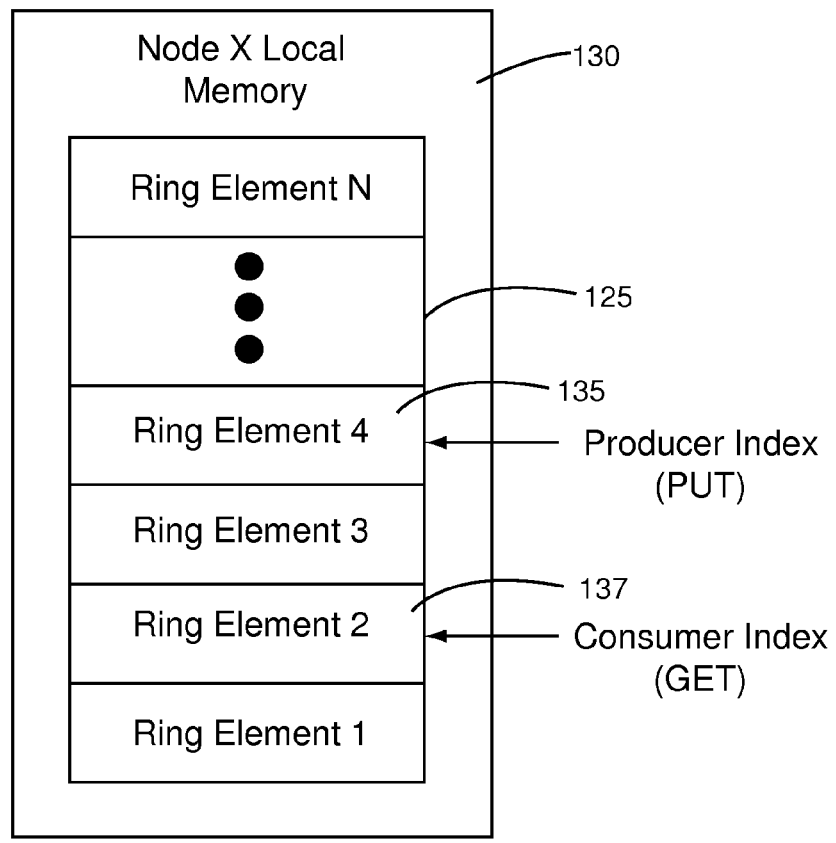
FIG. 2 shows a remote memory ring buffer within local memory of a target node of the data processing system shown in FIG. 1.

FIG. 2 shows a remote memory ring buffer 125 within local memory 130 of the target node 115. A PUT action from a particular one of the initiator nodes 105, 110 will result in writing of content from an application buffer on that particular one of the initiator nodes 105, 110 to a ring element 135 at a tail of the remote memory ring buffer 125 on the target node 115. A Producer Index (PUT) is an index into the remote memory ring buffer 125 that points to a location within the ring buffer where the next element must be put (i.e., in response to a PUT request for a currently implemented PUT action). A GET action from a particular one of the initiator nodes 105, 110 will result in a read of a ring element 137 at a head of the remote memory ring buffer 125 on the target node 115 into an application buffer on node A. A Consumer Index (GET) is an index into the ring buffer that points to a location within the ring buffer from where the next element must be read (i.e., in response to a GET request for a currently implemented GET action).

The remote memory ring buffer 125 contains a plurality of ring elements. The ring elements can be of variable size. An element length field of the shared ring element format specifies a length of the payload words (including the element length field). Using the element length field, hardware implementing remote memory GET/PUT functionality in accordance with the present invention is able to return a complete variable sized ring element at the head of the ring buffer in response to a GET action.

Figure 3:
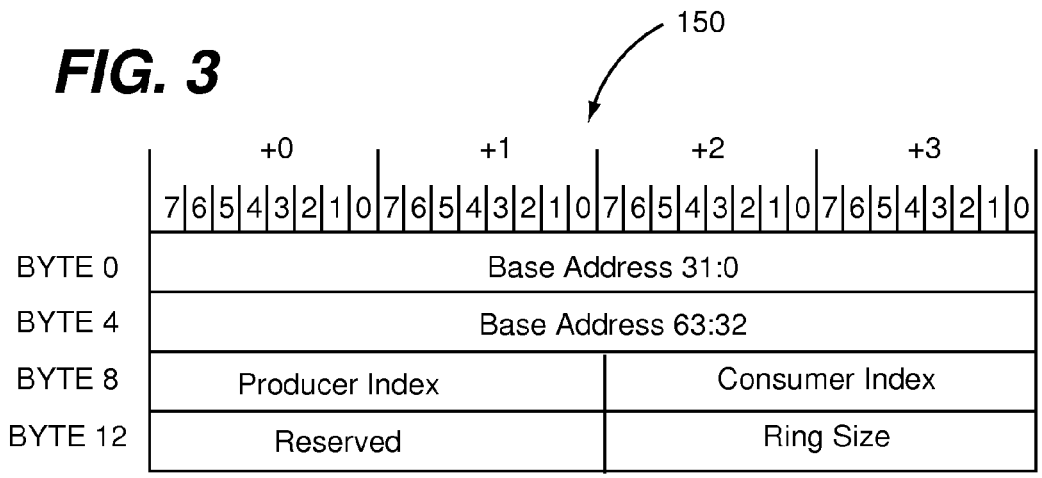
FIG. 3 shows an embodiment of a ring descriptor for each remote memory ring buffer on the target node of the data processing system shown in FIG. 1.

FIG. 3 shows an embodiment of a ring descriptor 150 for each remote memory ring buffer on the target node 115 (e.g., the remote memory ring buffer 125). Table 1 below describes the fields for the ring descriptor 150.

TABLE 1

Field Descriptions For Ring Descriptor

| Field | Description |
|---|---|
| Base Address | Specifies the 64-bit virtual address of the ring in node memory. The ring is not required to be in physically contiguous pages. The inter-node messaging module will use the MMU to access the contents of the ring using virtual addresses. |
| Producer Index | Specifies the current producer index of the ring. This field must be initialized to 0 when the ring is created by system software. After initialization, this field is updated by hardware. |

TABLE 1-continued

Field Descriptions For Ring Descriptor

| Field | Description |
|---|---|
| Consumer Index | Specifies the current consumer index of the ring. This field is updated by hardware during runtime. System software must initialize this field to 0 when the ring is created. |
| Ring Size | Specifies the size of the circular array in number of 32-bit words. This field must be initialized by system software based on the memory allocated for the circular array. |

When implementing remote memory GET/PUT functionality in accordance with the present invention, a PUT action that encounters a remote memory ring buffer that is full will fail at the target node. There are a number of approaches for responding to the remote memory ring buffer being full. One approach for responding to the remote memory ring buffer being full includes an error status being sent back to the application on the initiator node that initiated the PUT action (i.e., the initiating application). Optionally, in response to receiving the error status, the initiating application can choose to retry the PUT action at a later point in time. Another approach for responding to the remote memory ring buffer being full includes overwriting the oldest entry in the remote memory ring buffer and not returning an error status.

As previously disclosed, remote memory GET/PUT functionality in accordance with embodiments of the present invention are implemented using hardware (HW) supported GET/PUT contexts that can be mapped into address space of user level processes. A user level process (i.e., an application) can initiate a PUT or GET action by performing a series of stores to its allocated GET/PUT context. Only a single PUT or GET action may be outstanding on a given context. In other words, an application must poll for completion before reusing the same context to issue another GET or PUT action. Multiple GET/PUT actions (even to the same ring) may be outstanding across the different contexts.

The GET/PUT context defines the hardware-software interface for remote memory ring buffer operations. In one preferred embodiment, these hardware supported GET/PUT contexts are HW registers that are mapped into the address space of user level processes. In this regard, the HW implements multiple GET/PUT contexts (i.e. there are multiple copies of the registers). Each GET/PUT context is mapped to a different physical page in the address space of an initiator node so that it can be mapped to the address space of a user-level process. This allows the operating system (OS) of the initiator node to map each GET/PUT context to a different user process. If two GET/PUT contexts were located within the same page, it would not be possible for the OS to assign them to different processes since virtual memory is allocated on a page granularity. By virtue of the HW supported GET/PUT contexts being mapped into address space of user level processes, initiator nodes of a node cluster configured in accordance with the present invention can implement remote memory GET/PUT functionality using one or more remote memory ring buffers of a target node of the node cluster and without involvement of an OS kernel of any one of the nodes of the node cluster.

Figure 4:
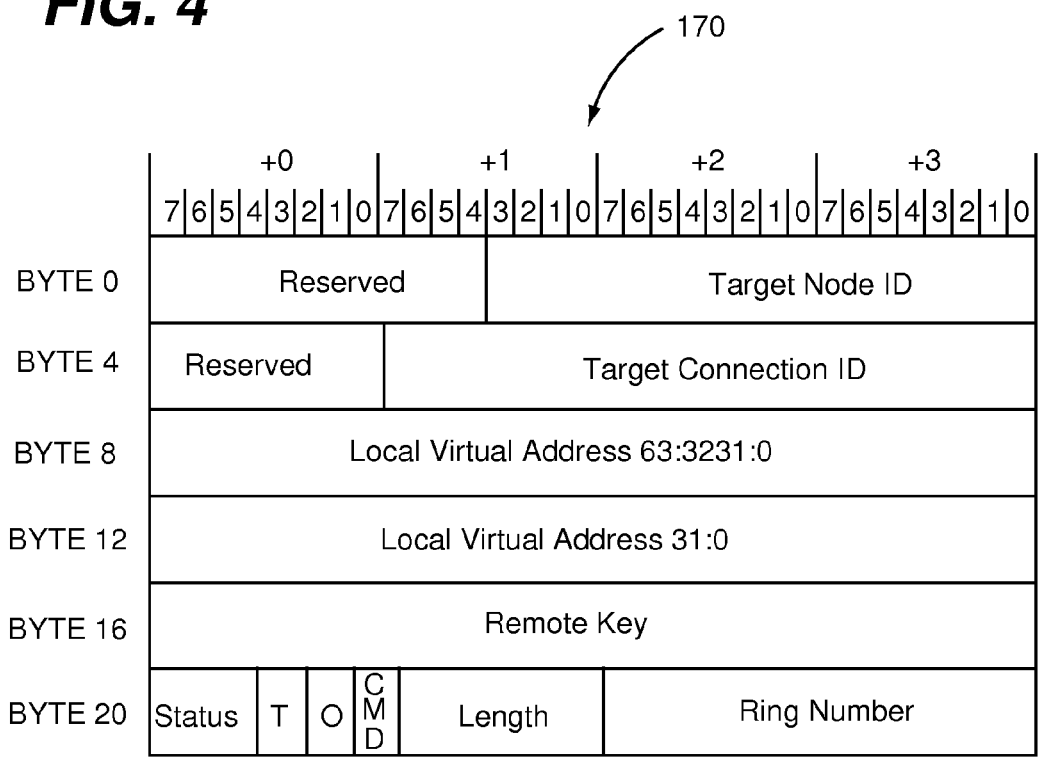
FIG. 4 shows an embodiment of a GET/PUT context format configured in accordance with an embodiment of the present invention.

FIG. 4 shows an embodiment of a GET/PUT context 170 configured in accordance with an embodiment of the present invention. Table 2 below describes the fields for the GET/PUT context 170.

TABLE 2

Field Descriptions For GET/PUT Context

| Field | Description |
|---|---|
| Target Node ID | Specifies the Node ID of the target node that contains the ring buffer. |
| Target Connection ID | Specifies the connection ID assigned by the target node for the Transport Layer reliable connection between the initiator node and target node. |
| Local Virtual Address | Specifies the virtual address of the local buffer containing the PUT/GET data. |
| Remote Key | Specifies the R_Key associated with the memory region on the target node containing the ring buffer. |
| Ring Number | Identifies a ring on the target node. |
| Length | Specifies the length of the GET/PUT payload in 32-bit words. |
| Command (CMD) | Set to 1 for a GET command and 0 for a PUT command |
| Overwrite (O) | If set to 1, the PUT will overwrite the oldest entry if the ring is full. If set to 0, the PUT will not be written if the ring is full and status will be returned indicating the PUT was not successful |
| Timestamp (T) | If set to 1, the fabric time will be included by the inter-node messaging module in the PUT request sent to the target node designating when a particular operation was performed in association with carrying out the PUT action. If set to 0, the PUT request will not include a timestamp. |
| Status | Software must set this field to 0 to indicate to the inter-node messaging module that a new GET/PUT command has been posted. The inter-node messaging module must update this field as shown below to indicate completion status:<br>00001b Command processed. Indicates that the inter-node messaging module has read the GET/PUT context;<br>00010b Command completed successfully;<br>00011b Transmit failure error. This error is signaled when repeated retransmit attempts are unsuccessful;<br>00100b Operational error; and<br>00101-11111b All other encodings reserved for future. |

Figure 5:
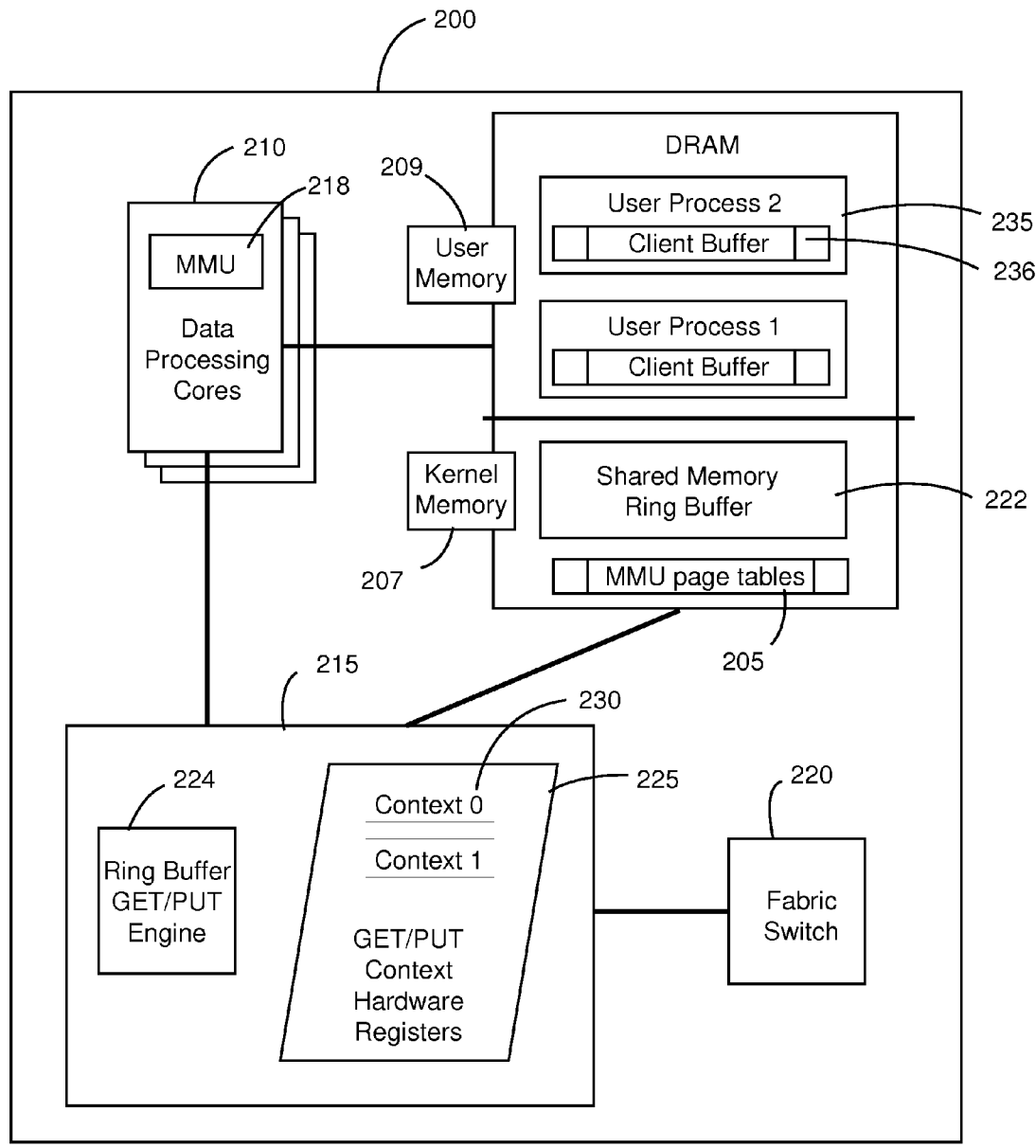
FIG. 5 shows an embodiment of a data processing node configured in accordance with an embodiment of the present invention.

FIG. 5 shows an embodiment of a data processing node 200 configured in accordance with an embodiment of the present invention, which can be an initiator node configured in accordance with the present invention (e.g., initiator nodes 105, 110 discussed above in reference to FIG. 1) or a target node configured in accordance with the present invention (e.g., target node 115 discussed above in reference to FIG. 1). The data processing node 200 includes DRAM (dynamic random access memory) 205, a plurality of data processing cores 210, an inter-node messaging module (IMM) 215 and a fabric switch 220, which are interconnected to each other (directly and/or indirectly) through one or more suitable interfaces. In certain embodiments, a preferred protocol for such a suitable interface is an on-chip bus configured in accordance with AXI4 (Advanced Extensible Interface 4) bus interface specification. AXI4 is the fourth generation of the Advanced Microcontroller Bus Architecture (AMBA) interface protocol of ARM Limited. However, as a skilled person will appreciate in view of the disclosures made herein, the present invention is not unnecessarily limited to a particular on-chip bus protocol.

The DRAM 205 is divided into kernel address space (i.e., kernel memory) 207 and user process address space (i.e., user memory) 209 by an operating system (OS) of the data processing node 200. In the case where the data processing node is serving as a target node, one or more remote memory ring buffers 222 can be allocated out of the kernel memory 207 or user memory 209. A memory management unit 218 of each one of the data processing cores 210 has a corresponding page table 240 within the kernel memory 207. The memory management unit 218 is a hardware unit in each one of the data processing cores 210, which has a pointer to a corresponding memory management unit page table 240 in the DRAM 205. The pointer provides mapping from virtual addresses to physical addresses.

The IMM 215 includes a remote memory ring buffer GET/PUT engine (ring buffer GET/PUT engine 224) and a plurality of sets of hardware registers 225 in combination with (e.g., within) the ring buffer GET/PUT engine 224. Each one of the sets of hardware registers 225 defines a respective instance of a GET/PUT context (i.e., the respective GET/PUT context 230). Each respective GET/PUT a context instance is mapped directly into the virtual address space of a corresponding user-level processes 235 such as by a mapping function of a particular one of the data processing cores 210. For example, the memory management unit 218 of the particular one of the data processing cores 210 can perform this mapping. In this regard, each one of a plurality of user level processes is mapped to a different one of the sets of hardware registers 225 and thereby to the respective GET/PUT context instance. Mapping each one of the user level processes to the different one of the sets of registers enables the particular one of the user level processes to utilize the respective GET/PUT context instance thereof for performing a GET/PUT action to a ring buffer of a target node (e.g., the target node 115 discussed above in reference to FIG. 1) through a fabric without involvement of an operating system (OS) of the data processing node 200 or any node connected thereto. Mapping each one of the user level processes to the different one of the sets of registers can includes modifying the corresponding memory management unit page table 240 for the particular one of the user level processes (i.e., of a particular one of the data processing cores 210) to include a virtual address page that maps to a physical address page for the respective GET/PUT context instance.

As previously disclosed, remote memory GET/PUT functionality in accordance with the present invention is advantageously implemented using hardware supported GET/PUT contexts. This hardware-supported implementation of remote memory GET/PUT functionality presents several distinguishing functionalities. One such functionality is that each one of the user processes 235 directly access context registers (i.e., a respective GET/PUT context instance 230) mapped to user virtual address space to initiate remote GET/PUT actions. Another such functionality is that, when the ring buffer GET/PUT engine 224 needs to send a packet associated with a GET/PUT action to another node on a fabric to which the data processing node 200 is attached, it sends this packet directly from within the IMM 215 through the fabric switch 220 into the fabric. Still another such functionality is that the ring GET/PUT Engine directly reads and stores data to/from client-side buffers 236 in user processes in association with performing GET/PUT action for the client-side user processes 236. As a target node, the ring GET/PUT engine 224 reads/writes to the one or more remote memory ring buffers 222 within the DRAM 205.

Figure 6:
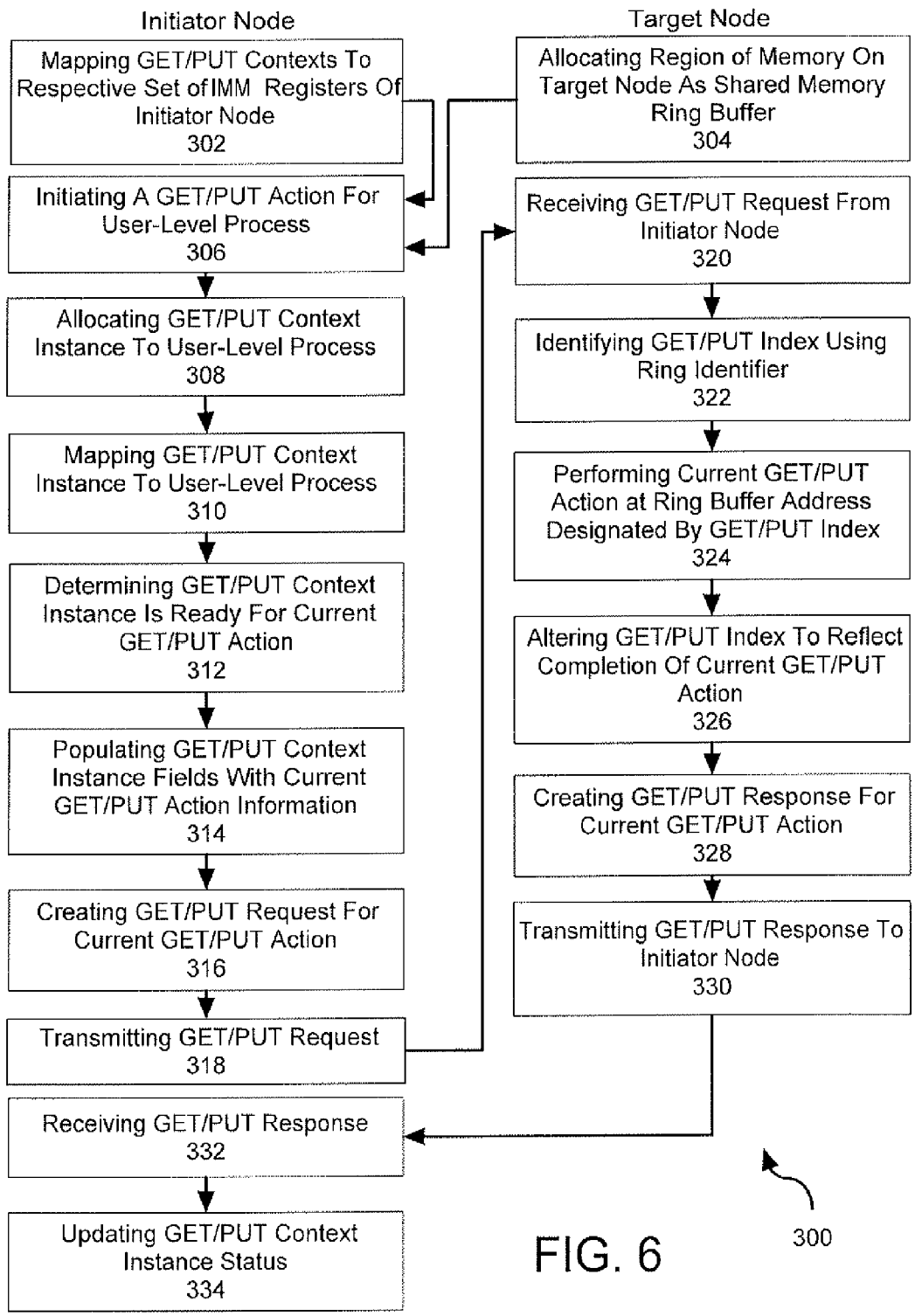
FIG. 6 shows a method for implementing remote memory GET/PUT functionality in accordance with an embodiment of the present invention.

Referring now to FIG. 6, a method 300 for implementing remote memory GET/PUT functionality in accordance with an embodiment of the present invention is shown. In this regard, an underlying objective of the method 300 is implementing remote memory GET/PUT functionality via one or more ring buffers that are shared by a cluster of SoC nodes that are attached through a fabric (i.e., a switched interconnect fabric) using hardware (HW) supported GET/PUT contexts. In doing so, the method 300 will provide for such remote memory GET/PUT functionality using one or more remote memory ring buffers and without involvement of an OS kernel of any one of the SoC nodes.

The method 300 begins with an initiator node performing an operation 302 for mapping a plurality of GET/PUT contexts to respective sets of registers within an inter-node messaging module of the initiator node (e.g., the IMM 215 of the data processing node 200 discussed above in reference to FIG. 5) and with a target node performing an operation 304 for allocating a region on its local memory (e.g., DRAM) as one or more remote memory ring buffers (i.e., having a remote memory ring buffer). An embodiment of a format for the GET/PUT contexts is disclosed above in reference to FIG. 4 and Table 2. An embodiment of a descriptor for the remote memory ring buffer is disclosed above in reference to FIG. 3 and Table 1.

In one specific example of mapping the plurality of GET/PUT contexts to respective sets of registers, there are four GET/PUT context instances are mapped to four sets of registers. Each set of registers includes 8 registers that define a GET/PUT context instance. A first GET/PUT context (i.e., GET/PUT context 0) is mapped to 8 registers at physical address BASE+0, a first GET/PUT context (i.e., GET/PUT context 1) is mapped to 8 registers at physical address BASE+64 KB, a third GET/PUT context (i.e., GET/PUT context 2) is mapped to 8 registers at physical address BASE+128 KB, and a fourth GET/PUT context (i.e., GET/PUT context 3) is mapped to 8 registers at physical address BASE+192 KB.

At some point in time after for mapping of the GET/PUT contexts and allocating the local memory as the remote memory ring buffer, the initiator node (e.g., a ring buffer GET/PUT engine thereof) performs an operation 306 for initiating a GET/PUT action for a particular user-level process running on a data processing core of the initiator node, an operation 308 for allocating a particular one of the GET/PUT context instances to the particular user-level process (i.e., one that is not currently allocated to another user-level process) and an operation 310 for mapping the particular one of the GET/PUT context instances to the particular user-level process.

In one specific example of initiating the GET/PUT action for the particular user-level process, the particular user-level process makes some call into a kernel memory space of the initiator node's DRAM (e.g., by opening a device via a device driver) that indicates that it wants to access a GET/PUT engine of the initiator node. In one specific example allocating the particular one of the GET/PUT context instances and mapping the particular one of the GET/PUT context instances, the kernel level driver will then allocate the particular one of the GET/PUT context instances to the particular user-level process and will map the particular one of the GET/PUT context instances to the particular user-level process such as by a MMU table for the particular user-level process being modified to have a virtual address page that maps to a physical address page for the particular one of the GET/PUT context instances. The kernel will set up a mapping in the particular user-level process to a first one of the Get/Put Context instances (e.g., Context 2) to some arbitrary virtual address in the particular user-level process (e.g., VA1) and can setup a mapping in another user-level process to a second one of the GET/PUT content instances (e.g., Context 3) to some arbitrary virtual address in other user-level process (say VA2). In this regard, the kernel maps the pages to VA1 and VA2 in the two user-level processes. It should be noted, however, that VA1 and VA2 are virtual addresses in the process address space for respective user-level processes and that they are not kernel virtual addresses. Accordingly, the particular user-level process is associated with the 8 registers at Context 2 that show up at address VA1 whereby the particular user-level process writes registers at the VA1 address page. The MMU of the data processing core handling the particular user-level process translates those virtual addresses to the BASE+128 KB physical address (i.e., for VA1). But, because the particular user level process is using Context 2, these addresses are translated to BASE+128 KB. VA1 maps to BASE+128 KB and then the address of each one of the registers in the particular one of the GET/PUT context instances is an offset that is added to base virtual (VA1) or physical address (BASE+128 KB). Internal communication components of the initiator node route that physical address to its IMM for allowing the IMM to decode the physical address as belonging to the ring buffer GET/PUT engine (i.e., the BASE+128 KB physical address is what is later used by the IMM in transmitting a GET/PUT request derived from the particular one of the GET/PUT context instances to the remote target.

Next, the initiator node performs an operation 312 for determining that the particular one of the GET/PUT context instances is ready for being instantiated in accordance with the GET/PUT action. For example, the particular user-level process can poll a status field of the particular one of the GET/PUT context instances to check whether a previously initiated GET/PUT action is completed. This operation is performed because only a single GET action or PUT action (i.e., universally referred to herein as a GET/PUT action) can be outstanding for a given context, although multiple GET/PUT actions can be outstanding across different GET/PUT context instances. In view of the GET/PUT context instances all being the same, a unique context number is provided in a respective field of each one of the GET/PUT context instances to enable operations issued by one GET/PUT context instance from another to be differentiated.

After determining that the particular one of the GET/PUT context instances is ready for being instantiated in accordance with the GET/PUT action, the initiator node performs an operation 314 for populating fields of the particular one of the GET/PUT context instances with information defining the GET/PUT action. The initiator node then performs an operation 316 for creating a GET/PUT Request (i.e., a packet) defined by information within the particular one of the GET/PUT context instances, followed by performing an operation 318 for transmitting the GET/PUT request for reception by the target node. In the case of the initiator node and the target node being SoC nodes, the GET/PUT request is transmitted over a fabric connected between the initiator node and the target node.

An embodiment of a GET Request packet 400 configured in accordance with an embodiment of the present invention is shown in FIG. 7. Table 3 below describes the fields for the GET Request packet 400.

TABLE 3

Field Descriptions and Values For Remote Memory GET Request Packet

| Field | Value | Description |
|---|---|---|
| Protocol Type | "Remote Memory" encoding | Indicates to the Transport Layer the upper layer protocol type |
| Destination Connection ID | <0x000001-0xFFFFFF> | Indicates to the Transport Layer the connection ID number assigned by the target node to uniquely identify the reliable connection that has been opened between the iniatior node and target nodes. |
| Packet Type | "Ring GET Request" encoding | Indicates to the Transport Layer the type of packet that is being sent/received |
| Packet Sequence Number | <0x000000-0xFFFFFF> | The sequence number is used by the Transport Layer to identify each packet that has been sent from the initiator node to the target node in order to implement a reliable connection. |
| Total Length | <0x0001-0xFFFF> | Specifies the total length in bytes of Transport Layer packet |
| Ring Number | <0x0000-0xFFFF> | Indicates the number of the ring on the target node that is the target of the GET action. |

An embodiment of a PUT Request packet 405 configured in accordance with an embodiment of the present invention is shown in FIG. 8. Table 4 below describes the fields for the PUT Request packet 405.

TABLE 4

Field Descriptions For Remote Memory PUT Request Packet

| Field | Value | Description |
|---|---|---|
| Protocol Type | "Remote Memory" encoding | Indicates to the Transport Layer the upper layer protocol type |
| Destination Connection ID | <0x000001-0xFFFFFF> | Indicates to the Transport Layer the connection ID number assigned by the target node to uniquely identify the reliable connection that has been opened between the iniatior node and target nodes. |
| Packet Type | "Ring PUT Request" encoding | Indicates to the Transport Layer the type of packet that is being sent/received |
| Packet Sequence Number | <0x000000-0xFFFFFF> | The sequence number is used by the Transport Layer to identify each packet that has been sent from the initiator node to the target node in order to implement a reliable connection. |
| Total Length | <0x0001-0xFFFF> | Specifies the total length in bytes of Transport Layer packet |
| Ring Number | <0x0000-0xFFFF> | The number of the ring that is the target of the PUT action. |
| PUT Length | <0x00-0xFF> | The length of the PUT payload in 32-bit words. |
| Overwrite Flag (O) | <0 or 1> | If this bit is set to 1, the target is permitted to overwrite the oldest entry in the ring if the ring is full. If this field is set to 0, the inter-node messaging module on the target ensures that the PUT is not completed until there is space on the target ring. |
| Timestamp Flag (T) | <0 or 1> | If this bit is set to 1, packet contains a timestamp. If this bit is set to 0, no timestamp is included in the packet. |
| Timestamp | 64-bit time | These fields are only valid when the T-Flag bit is set to 1, in which case the field contains the timestamp taken when the PUT was processed by the inter-node messging module at the initiator node. If the T-Flag bit is set to 0, this field is reserved. |
| PUT Payload | 1 to 256 bytes of data | Content to be put into the ring buffer |

In response to the target node successfully performing an operation 320 for receiving the GET/PUT request, the target node performs an operation 322 for identifying a GET/PUT index (e.g., a Producer index in the case of a PUT action and a Consumer index in the case of a GET action) for the remote memory ring buffer using a ring identifier specified in or derived from information in the GET/PUT request. The target node then performs an operation 324 for performing the GET/PUT action (i.e., retrieving data from within the remote memory ring buffer or storing data within the remote memory ring buffer) at an address defined by the GET/PUT index. After the GET/PUT action is successfully completed, the target node performs an operation 326 for altering the GET/PUT index to reflect completion of the GET/PUT action. One embodiment of altering the GET/PUT index to reflect completion of the GET/PUT action includes incrementing and wrapping the GET/PUT index.

Next, the target node performs an operation 328 for creating a GET/PUT Response (i.e., a packet) defined by information within the GET/PUT request and information associated with completion of the GET/PUT action, followed by performing an operation 330 for transmitting the GET/PUT response for reception by the initiator node. In the case of the initiator node and the target node being SoC nodes, the GET/PUT response is transmitted over a fabric connected between the initiator node and the target node.

An embodiment of a GET Response packet 410 configured in accordance with an embodiment of the present invention is shown in FIG. 9. Table 5 below describes the fields for the GET Response packet 410.

TABLE 5

Field Descriptions For Remote Memory GET Response Packet

| Field | Value | Description |
|---|---|---|
| Protocol Type | "Remote Memory" encoding | Indicates to the Transport Layer the upper layer protocol type |

TABLE 5-continued

Field Descriptions For Remote Memory GET Response Packet

| Field | Value | Description |
|---|---|---|
| Destination Connection ID | <0x000001-0xFFFFFF> | Indicates to the Transport Layer the connection ID number assigned by the target node to uniquely identify the reliable connection that has been opened between the iniatior node and target nodes. |
| Packet Type | "Ring GET Response" encoding | Indicates to the Transport Layer the type of packet that is being sent/received |
| Packet Sequence Number | <0x000000-0xFFFFFF> | The sequence number is used by the Transport Layer to identify each packet that has been sent from the initiator node to the target node in order to implement a reliable connection. |
| Total Length | <0x0001-0xFFFF> | Specifies the total length in bytes of Transport Layer packet |
| Ring Number | <0x0000-0xFFFF> | The number of the ring that was used for the target of the GET action. |
| GET Length | <0x00-0xFF> | The length of the GET payload in 32-bit words. |
| Status | <0x00-0xFF> | Result of the GET action, encoded as follows:<br>0 GET command completed successfully;<br>1 Operational error at the target node;<br>2 Invalid ring number;<br>3 GET length larger than configured ring size; and<br>4-255 Reserved for future use. |
| GET Payload | 1 to 256 bytes of data | Content retrieved from ring buffer |

An embodiment of a PUT Response packet 415 configured in accordance with an embodiment of the present invention is shown in FIG. 10. Table 6 below describes the fields for the PUT Response packet 415.

TABLE 6

Field Descriptions For Remote Memory PUT Response Packet

| Field | Value | Description |
|---|---|---|
| Protocol Type | "Remote Memory" encoding | Indicates to the Transport Layer the upper layer protocol type |
| Destination Connection ID | <0x000001-0xFFFFFF> | Indicates to the Transport Layer the connection ID number assigned by the target node to uniquely identify the reliable connection that has been opened between the iniatior node and target nodes. |
| Packet Type | "Ring PUT Request" encoding | Indicates to the Transport Layer the type of packet that is being sent/received |
| Packet Sequence Number | <0x000000-0xFFFFFF> | The sequence number is used by the Transport Layer to identify each packet that has been sent from the initiator node to the target node in order to implement a reliable connection. |
| Total Length | <0x0001-0xFFFF> | Specifies the total length in bytes of Transport Layer packet |
| Ring Number | <0x0000-0xFFFF> | The number of the ring that was used for the target of the PUT action. |
| PUT Length | <0x00-0xFF> | The length of the PUT payload in 32-bit words. |
| Status | <0x00-0xFF> | Result of the PUT action, encoded as follows:<br>0 PUT command completed successfully;<br>1 Operational error at the target node;<br>2 Invalid ring number; |

TABLE 6-continued

Field Descriptions For Remote Memory PUT Response Packet

| Field | Value | Description |
|---|---|---|
| | | 3 PUT length larger than configured ring size; and |
| | | 4-255 Reserved for future use. |

In response to the initiator node successfully performing an operation 332 for receiving the GET/PUT response, the initiator node performs an operation 334 for updating the particular one of the GET/PUT context instances as being ready for a next GET/PUT action. In the case of the GET/PUT action having been a GET action, the initiator node also performs an operation for writing retrieved data into the local virtual address specified in the particular one of the GET/PUT context instances and based on the context number in the GET response packet.

It is disclosed herein that a PUT request configured in accordance with an embodiment of the present invention can include timestamp information. For example, as disclosed above, the GET/PUT context 170 discussed in reference to FIG. 4 and Table 2 includes a field (i.e., Timestamp (T)) for designating if an associated PUT request must include the timestamp information for when a particular operation was performed in association with carrying out a PUT action of the PUT request (e.g., when the PUT action was initiated, when the PUT request was created, when the PUT request was transmitted, etc). Accordingly, if the flag (e.g., bit) of the Timestamp (T) field in an instance of the GET/PUT context 170 is set for requiring timestamp information to be included in the PUT request sent to the target node, the PUT request packet(s) created using this GET/PUT context instance contains a timestamp information designating when the particular operation was performed in association with carrying out the PUT action.

The timestamp information is based on a time that is synchronized between, the initiator node, the target node and any other node(s) connected thereto (i.e., all nodes within a cluster of nodes). In preferred embodiments, this synchronized time is provided via a hardware-implemented service (e.g., implemented within hardware floating-point computation processors of each one of the nodes) Implementing the time synchronization as a hardware-implemented service is advantageous because a hardware implementation enables a very high rate of time sync packet exchanges to be sustained, which results in the nodes of the fabric (i.e., a node cluster) converging to a common time much faster than when time synchronization is provided as a software-implemented service. Further details of implementing the time synchronization as a hardware-implemented service are described in U.S. Non-Provisional patent application Ser. No. 13/899,751 filed on May 22, 2013 and entitled "TIME SYNCHRONIZATION BETWEEN NODES OF A SWITCHED INTERCONNECT FABRIC", which is incorporated herein in its entirety by reference.

It is disclosed herein that remote memory GET/PUT functionality in accordance with embodiments of the present invention can use security keys to create a trusted collection of getters/putters to a given remote memory ring buffer. When a particular remote memory ring buffer is created by a target node, the target node creates a remote node security key (i.e., R_Key) for provides an authentication mechanism to allow initiator nodes to have access to the particular remote memory ring buffer. As disclosed above, the GET/PUT context 170 discussed in reference to FIG. 4 and Table 2 includes a field for designating the remote node security key. An initiator node requests the remote node security key "out of band" (e.g. via networking) when it requests access to the particular remote memory ring buffer. Once the initiator node is in possession of the remote node security key, it puts it in GET/PUT context instances associated with the particular remote memory ring buffer. An instance of the remote node security key is carried in the GET/PUT requests derived using the GET/PUT context instances associated with the particular remote memory ring buffer. The target node uses the instance of the remote node security key received in a particular GET/PUT request for verifying authenticity of that particular and this allowing the associated GET/PUT action if such authentication is successful or inhibiting the associated GET/PUT action if such authentication is unsuccessful.

It is disclosed herein that, in view of the disclosure made herein, a skilled person will appreciate that remote memory GET/PUT functionality in accordance with embodiments of the present invention can be utilized for implementing continuous cluster level tracing. To this end, remote memory GET/PUT functionality in accordance with embodiments of the present invention provide a means of effectively, efficiently, and reliably emitting time-stamped events into hardware-managed remote memory ring buffers (i.e., remote memory ring buffers) to provide a cluster-wide debug and performance tuning buffer. These hardware-managed remote memory ring buffers, which are implemented in the local memory of a node of a cluster of nodes (i.e., the target node), can be accessed by other nodes of the cluster (e.g., initiator nodes) and used as an append or intent log.

In view of the disclosures made herein, a skilled person will appreciate that a system on a chip (SoC) refers to integration of one or more processors, one or more memory controllers, and one or more I/O controllers onto a single silicon chip. Furthermore, in view of the disclosures made herein, the skilled person will also appreciate that a SoC configured in accordance with the present invention can be specifically implemented in a manner to provide functionalities definitive of a server. In such implementations, a SoC in accordance with the present invention can be referred to as a server on a chip. In view of the disclosures made herein, the skilled person will appreciate that a server on a chip configured in accordance with the present invention can include a server memory subsystem, a server I/O controllers, and a server node interconnect. In one specific embodiment, this server on a chip will include a multi-core CPU, one or more memory controllers that support ECC, and one or more volume server I/O controllers that minimally include Ethernet and SATA controllers. The server on a chip can be structured as a plurality of interconnected subsystems, including a CPU subsystem, a peripherals subsystem, a system interconnect subsystem, and a management subsystem.

An exemplary embodiment of a server on a chip (i.e. a SoC unit) that is configured in accordance with the present invention is the ECX-1000 Series server on a chip offered by Calxeda incorporated. The ECX-1000 Series server on a chip includes a SoC architecture that provides reduced power consumption and reduced space requirements. The ECX-1000 Series server on a chip is well suited for computing environments such as, for example, scalable analytics, webserving, media streaming, infrastructure, cloud computing and cloud storage. A node card configured in accordance with the present invention can include a node card substrate having a plurality of the ECX-1000 Series server on a chip instances (i.e., each a server on a chip unit) mounted on the node card substrate and connected to electrical circuitry of the node card substrate. An electrical connector of the node card enables communication of signals between the node card and one or more other instances of the node card.

The ECX-1000 Series server on a chip includes a CPU subsystem (i.e., a processor complex) that uses a plurality of ARM brand processing cores (e.g., four ARM Cortex brand processing cores), which offer the ability to seamlessly turn on-and-off up to several times per second. The CPU subsystem is implemented with server-class workloads in mind and comes with a ECC L2 cache to enhance performance and reduce energy consumption by reducing cache misses. Complementing the ARM brand processing cores is a host of high-performance server-class I/O controllers via standard interfaces such as SATA and PCI Express interfaces. Table 7 below shows technical specification for a specific example of the ECX-1000 Series server on a chip.

TABLE 7

| | Example of ECX-1000 Series server on a chip technical specification |
|---|---|
| Processor Cores | 1. Up to four ARM ® Cortex ™-A9 cores @ 1.1 to 1.4 GHz<br>2. NEON ® technology extensions for multimedia and SIMD processing<br>3. Integrated FPU for floating point acceleration<br>4. Calxeda brand TrustZone ® technology for enhanced security<br>5. Individual power domains per core to minimize overall power consumption |
| Cache | 1. 32 KB L1 instruction cache per core<br>2. 32 KB L1 data cache per core<br>3. 4 MB shared L2 cache with ECC |
| Fabric Switch | 1. Integrated 80 Gb (8 × 8) crossbar switch with through-traffic support<br>2. Five (5) 10 Gb external channels, three (3) 10 Gb internal channels<br>3. Configurable topology capable of connecting up to 4096 nodes<br>4. Dynamic Link Speed Control from 1 Gb to 10 Gb to minimize power and maximize performance<br>5. Network Proxy Support to maintain network presence even with node powered off |
| Management Engine | 1. Separate embedded processor dedicated for systems management<br>2. Advanced power management with dynamic power capping<br>3. Dedicated Ethernet MAC for out-of-band communication<br>4. Supports IPMI 2.0 and DCMI management protocols<br>5. Remote console support via Serial-over-LAN (SoL) |
| Integrated Memory Controller | 1. 72-bit DDR controller with ECC support<br>2. 32-bit physical memory addressing<br>3. Supports DDR3 (1.5 V) and DDR3L (1.35 V) at 800/1066/1333 MT/s<br>4. Single and dual rank support with mirroring |

TABLE 7-continued

| | Example of ECX-1000 Series server on a chip technical specification |
|---|---|
| PCI Express | 1. Four (4) integrated Gen2 PCIe controllers<br>2. One (1) integrated Gen1 PCIe controller<br>3. Support for up to two (2) PCIe x8 lanes<br>4. Support for up to four (4) PCIe x1, x2, or x4 lanes |
| Networking Interfaces | 1. Support 1 Gb and 10 Gb Ethernet<br>2. Up to five (5) XAUI 10 Gb ports<br>3. Up to six (6) 1 Gb SGMII ports (multiplexed w/XAUI ports)<br>4. Three (3) 10 Gb Ethernet MACs supporting IEEE 802.1Q VLANs, IPv4/6 checksum processing, and TCP/UDP/ICMP checksum offload<br>5. Support for shared or private management LAN |
| SATA Controllers | 1. Support for up to five (5) SATA disks<br>2. Compliant with Serial ATA 2.0, AHCI Revision 1.3, and eSATA specifications<br>3. SATA 1.5 Gb/s and 3.0 Gb/s speeds supported |
| SD/eMMC Controller | 1. Compliant with SD 3.0 Host and MMC 4.4 (eMMC) specifications<br>TCP/UDP/ICMP checksum offload<br>5. Support for shared or private management LAN |
| SATA Controllers | 1. Support for up to five (5) SATA disks<br>2. Compliant with Serial ATA 2.0, AHCI Revision 1.3, and eSATA specifications<br>3. SATA 1.5 Gb/s and 3.0 Gb/s speeds supported |
| SD/eMMC Controller | 1. Compliant with SD 3.0 Host and MMC 4.4 (eMMC) specifications<br>2. Supports 1 and 4-bit SD modes and 1/4/8-bit MMC modes<br>3. Read/write rates up to 832 Mbps for MMC and up to 416 Mbps for SD |
| System Integration Features | 1. Three (3) I2C interfaces<br>2. Two (2) SPI (master) interface<br>3. Two (2) high-speed UART interfaces<br>4. 64 GPIO/Interrupt pins<br>5. JTAG debug port |

While the foregoing has been with reference to a particular embodiment of the invention, it will be appreciated by those skilled in the art that changes in this embodiment may be made without departing from the principles and spirit of the disclosure, the scope of which is defined by the appended claims.

What is claimed is:

1. A method comprising:
   mapping, at a first data processing node, a user level process to a particular set of a plurality of sets of registers, wherein the plurality of sets of registers are on an inter-node messaging module of the first data processing node, and wherein each set of registers is configured to define a context instance such that the user level process is mapped to a respective context instance;
   assessing, by the user level process, a status of a previous action to a ring buffer in local memory of a second data processing node, wherein the previous action used the same respective context instance;
   populating, by the user level process, fields of the respective context instance with information for a current action to the ring buffer in response to determining that the previous action is completed;
   creating, by the inter-node messaging module of the first data processing node, a request based on the information that populates the fields of the respective context instance, wherein the information includes an identifier for the second data processing node and a ring buffer identifier; and
   causing, by the inter-node messaging module of the first data processing node, the request to be transmitted for reception by the second data processing node.

2. The method of claim 1, wherein mapping the user level processes to the respective context instance comprises modifying a memory management unit page table to include a virtual address page for the user level process that maps to a physical address page for the respective context instance.

3. The method of claim 1, further comprising:
receiving, by an inter-node message module of the second data processing node, the request message;
identifying, at the second data processing node, an index within a ring descriptor structure based on the ring buffer identifier;
performing, at the second data processing node, the action at a location within the ring buffer designated by the index; and
altering, at the second data processing node, the index to reflect completion of the action.

4. The method of claim 1, wherein:
the action is a PUT action; and
populating fields of the respective context instance comprises setting a field of the context for enabling a PUT request for the PUT action to include a timestamp value, wherein the timestamp value designates a fabric time at which the PUT action was initiated.

5. The method of claim 4, further comprising:
determining the fabric time using a time synchronization service, wherein the time synchronization service runs across the fabric in a distributed manner on the data processing nodes, and wherein the time synchronization service is hardware-implemented on each of the data processing nodes.

6. The method of claim 1, further comprising:
generating, by the inter-node messaging module of the first data processing node, a PUT request based on information from the respective context instance;
wherein the current action is a PUT action; and
wherein the PUT request includes information corresponding to a fabric time at which the PUT action was initiated.

7. The method of claim 1, further comprising:
receiving, at the first data processing node, a remote node security key from the second data processing node;
wherein the respective context instance includes a field configured to hold the remote node security key; and
verifying, at the second data processing node, authenticity of the request based on the remote node security key.

8. A data processing node comprising:
an inter-node messaging module including a plurality of sets of registers, wherein each set of registers is configured to define a context instance; and
a plurality of data processing cores each coupled to the inter-node messaging module, wherein each of the plurality of data processing cores is configured to map a user level process thereof to one of the plurality of sets of registers and thereby to a respective context instance;
wherein the user level process is configured to utilize the respective context instance to perform an action to a ring buffer of a target data processing node, and wherein the target data processing node is coupled to the data processing node through a fabric; and
wherein the user level process is further configured to:
determine a status of the respective context instance; and
populate the respective context instance with information for the action in response to a determination that a previously instantiated action is completed, wherein the previously instantiated action used the same respective context instance.

9. The data processing node of claim 8, wherein each of the plurality of data processing cores is further configured to modify a memory management unit page table to include a virtual address page for the user level process that maps to a physical address page for the respective context instance.

10. The data processing node of claim 8, wherein:
each of the context instances comprises a field configured to specify a length of a payload for a respective action;
a first element of the ring buffer is configured to store a first payload for a first action of a first user level process;
a second element of the ring buffer is configured to store a second payload for a second action of a second user level process; and
the first element of the ring buffer is of a different size than the second element of the ring buffer.

11. The data processing node of claim 8, further comprising:
a memory management unit coupled to the plurality of data processing cores;
wherein each of the plurality of data processing cores is further configured to modify a page table to include a virtual address page for the user level process that maps to a physical address page for the respective context instance;
wherein the memory management unit is configured to translate a virtual address specified at the virtual address page to a physical address specified at the physical address page in response to the user level process populating the respective context instance with information for the action; and
wherein the inter-node messaging module is configured to associate the physical address with a module thereof in response to being provided with the physical address and to cause the module to perform the action for the user level process.

12. The data processing node of claim 11, wherein:
each of the context instances comprises a field configured to specify a length of a payload for a respective action;
a first element of the ring buffer is configured to store a first payload for a first action of a first user level process;
a second element of the ring buffer is configured to store a second payload for a second action of a second user level process; and
the first element of the ring buffer is of a different size than the second element of the ring buffer.

13. The data processing node of claim 8, further comprising:
a memory management unit coupled to the plurality of data processing cores; and
a kernel-level driver coupled to the plurality of data processing cores and to the memory management unit;
wherein the kernel-level driver is configured to modify a page table to include a virtual address page for the user level process that maps to a physical address page for the respective context instance in response to being called upon by the user level process in association with initiating the action;
wherein the user level process is further configured to populate the respective context instance with information for the action in response to determining that a previously instantiated action is completed, and wherein the previously instantiated action used the same respective context instance;
wherein the memory management unit is configured to translate a virtual address specified at the virtual address page to a physical address specified at the physical address page in response to population, by the user level process, of the respective context instance with information for the action; and wherein the inter-node messaging module is configured to associate the physical address with a module thereof in response to being provided with the physical address and to cause the module to perform the action for the user level process.

14. The data processing node of claim 8, wherein:

the action is a PUT action; and the respective context instance comprises a field configured to enable a PUT request for the PUT action to include a timestamp value, wherein the time stamp value designates a fabric time at which the PUT action was initiated.

15. The data processing node of claim 14, wherein:

the data processing node is one of a plurality of data processing nodes connected to each other through a fabric;

the fabric time is determined using a time synchronization service, wherein the time synchronization service is configured to run across the fabric in a distributed manner on the plurality of data processing nodes; and the time synchronization service is hardware-implemented on each of the plurality of data processing nodes.

16. The data processing node of claim 8, wherein:

the action is a PUT action;

the inter-node messaging module is configured to generate a PUT request based on information from the respective context instance; and the PUT request comprises fabric time information corresponding to a fabric time at which the PUT action was initiated.

17. The data processing node of claim 8, wherein:

the data processing node is configured to receive a remote node security key from the target data processing node; and a request for the action comprises an instance of the remote node security key, wherein the target data processing node is configured to verify authenticity of the request based on the instance of the remote node security key.

18. The data processing node of claim 17, wherein:

the respective context instance comprises a field configured to hold the remote node security key; and the inter-node messaging module is configured to generate the request based on information from the respective context instance.

19. A data processing system comprising:

a target node including a ring buffer in local memory thereof; and a plurality of initiator nodes connected to each other and to the target node through a fabric, wherein each of the initiator nodes includes:

an inter-node messaging module comprising a plurality of sets of registers, wherein each set of registers is configured to define a context instance; and a plurality of data processing cores each coupled to the inter-node messaging module, wherein each of the plurality of data processing cores is configured to map a user level process thereof to one of the sets of registers and thereby to a respective context instance;

wherein the user level process is configured to utilize the respective context instance to perform an action to the ring buffer of the target node through the fabric; wherein the user level process is further configured to:

determine a status of the respective context instance; and populate the respective context instance with information for the action in response to a determination that a previously instantiated action is completed, wherein the previously instantiated action used the same respective context instance.

* * * * *